United States Patent [19]
Yazawa et al.

[11] Patent Number: 5,870,128
[45] Date of Patent: Feb. 9, 1999

[54] LIGHT-EMITTING DEVICE ASSEMBLY HAVING IN-LINE LIGHT-EMITTING DEVICE ARRAYS AND MANUFACTURING METHOD THEREFOR

[75] Inventors: Yoshiaki Yazawa; Shoich Kondo; Shinnosuke Takaki, all of Niigata, Japan

[73] Assignee: Nippon Seiki K.K., Niigata, Japan

[21] Appl. No.: 652,036

[22] Filed: May 23, 1996

[30] Foreign Application Priority Data

May 31, 1995 [JP] Japan ................................. 7-158720

[51] Int. Cl.$^6$ .......................... B41J 2/385; G03G 13/04
[52] U.S. Cl. .......................... 347/130; 347/238; 347/245
[58] Field of Search .................................. 347/238, 130, 347/245, 42; 257/88, 99, 100

[56] References Cited

U.S. PATENT DOCUMENTS

| | | | |
|---|---|---|---|
| 4,536,778 | 8/1985 | Schamphelaere et al. | 346/160 |
| 4,829,324 | 5/1989 | Drake et al. | 346/140 |
| 5,160,403 | 11/1992 | Fisher et al. | 156/633 |
| 5,177,500 | 1/1993 | Ng | 346/107 |
| 5,237,347 | 8/1993 | Teshigawara et al. | 346/160 |
| 5,258,778 | 11/1993 | Creutzmann et al. | 346/107 |
| 5,469,199 | 11/1995 | Allen et al. | 347/42 |
| 5,477,259 | 12/1995 | Iwasa | 347/238 |
| 5,660,461 | 8/1997 | Ignatius et al. | 362/241 |

*Primary Examiner*—Safet Metjahic
*Assistant Examiner*—Christopher E. Mahoney
*Attorney, Agent, or Firm*—McDermott, Will & Emery

[57] ABSTRACT

There is disclosed a light-emitting device assembly use in a large-sized printhead. The assembly includes a number of insulating substrates including first and second substrates. A conducting layer is formed on each substrate. A conductive adhesive layer is formed on the conducting layer. The conducting layer on the first substrate extends close to the abutting end of this substrate. The conducting layer on the second substrate is set back a first distance from the abutting end of the second substrate. Light-emitting devices are disposed in the vicinity of the abutting end of the conducting layer on the second substrate. Light-emitting devices on the first substrate are made to protrude a second distance greater than the first distance from the abutting end of the first substrate. The light-emitting array protruding from the first substrate is made to bear against the light-emitting device array set back from the abutting end of the second substrate. Thus, the substrates are connected to each other such that the arrays are arranged in line.

7 Claims, 1 Drawing Sheet

LIGHT-EMITTING DEVICE ASSEMBLY HAVING IN-LINE LIGHT-EMITTING DEVICE ARRAYS AND MANUFACTURING METHOD THEREFOR

BACKGROUND OF THE INVENTION

1. Field of the Invention

The present invention relates to a light-emitting device assembly and, more particularly, to a light-emitting device assembly comprising a row of insulating substrates on which light-emitting devices are arranged in line to obtain a light-emitting region of desired size. The invention also relates to a method of fabricating such a light-emitting device assembly.

2. Description of the Prior Art

A known light-emitting device assembly is disclosed in Japanese Patent Publication No. 42188/1991 (corresponding to U.S. Pat. No. 4,536,778). To fabricate this assembly, a plurality of insulating substrates are first prepared. The substrates have desired metallization patterns. On each substrate, an array of light-emitting devices and driver ICs for driving the array are installed. The array of light-emitting devices has a plurality of light-emitting devices (LEDs) formed on a common conducting electrode. The substrates are connected to each other so that the light-emitting devices are arranged in line in the direction of the arrangement of the substrates. Thus, the assembly has desired light-emitting regions.

Where this light-emitting device assembly is used as a printhead of the A4 size, for example, the accuracy at which the arrays of the light-emitting devices are arranged linearly must be enhanced, taking account of the linear arrangement of the light-emitting devices, in order to improve the print quality. For this purpose, if the dimensions of the substrates taken in the main scan direction in which the light-emitting devices are scanned are the A4 size, then distortion of the substrates or heat generated by the light-emitting devices produces a deformation, thus deteriorating the accuracy at which the light-emitting device arrays are installed in line. The size referred to hereinafter is taken in the main scan direction. More specifically, the light-emitting device arrays must be arranged in the direction of arrangement of the substrates to a tolerance of about ±15 microns. In order to obtain the desired size, the short substrates are connected to each other and arranged in line. In this case, since the light-emitting device arrays are minute, if the end surfaces of the substrates are made to abut against each other to align the arrays, then it is difficult to arrange the light-emitting device arrays with a high linearity. Furthermore, in order to obtain finer print characters, it is necessary that the light-emitting points be spaced only tens of micrometers from each other. Consequently, it has been difficult to bring the outermost light-emitting device in the array on the side of the abutting end close to the opposite light-emitting device in the other array such that the equal spacing between the light-emitting devices is maintained. To circumvent this problem, the light-emitting device assembly has been fabricated in the manner described below. First, the light-emitting device arrays on the sides of the abutting ends are mounted in such a way that the arrays protrude from the end surfaces of the substrates. The protruding end surfaces of the arrays are made to bear against each other. The substrates are placed in such a manner that the arrays are arranged in line. The substrates are then coupled together with connecting members. As a consequence, the arrays are arranged linearly. The light-emitting spots are uniformly spaced from each other. In this way, the light-emitting device assembly having the desired size is obtained.

In recent years, as technology for fabricating substrates evolves, fabrication of a relatively large (approximately the A4 size) unitary substrate has been made feasible. However, as larger printheads are used, larger substrates (such as A1 or A0 size) have been required. Therefore, the prior art method relying on even such relatively large substrates has limitations. Furthermore, the cost of fabricating these large substrates presents problems. For example, in order to obtain a light-emitting device assembly of the A1 size, four light-emitting device installation substrates of the A4 size must be connected to each other in line. Concomitantly, the technique for mounting and placing light-emitting devices across the junctions of the substrate is still necessary.

SUMMARY OF THE INVENTION

Accordingly, it is an object of the present invention to provide a light-emitting device assembly comprising interconnected substrates on which light-emitting device arrays are arranged in line accurately to produce light-emitting regions of a desired size.

It is another object of the invention to provide a method of fabricating a light-emitting device assembly from a plurality of substrates to arrange a plurality of light-emitting device arrays in line accurately.

A light-emitting device assembly according to the present invention has at least two insulating substrates, including first and second substrates, connected to each other to achieve the above objects. A plurality of light-emitting device arrays are installed on a conducting layer formed on each insulating substrate. This assembly is fabricated in the manner described below. The conducting layer on the first substrate is formed up to vicinities of the abutting end of the first substrate. The conducting layer on the second substrate is set back a first distance from the abutting end of this second substrate. A conductive adhesive layer is formed on each conducting layer. Light-emitting device arrays to be installed on the second substrate are disposed up to vicinities of the abutting end of the second insulating substrate. The arrays on the side of the abutting end of the first substrate are made to protrude a distance from the abutting end of the first substrate. This distance is in excess of the aforementioned first distance. The light-emitting device array protruding from the first substrate is brought into abutting engagement with the light-emitting device array over the second substrate which is set back from the abutting end of the second substrate. Thus, the substrates are connected to each other and arranged in line.

Therefore, where a light-emitting device assembly having light-emitting regions of a given size is fabricated by interconnecting the insulating substrates on which the light-emitting device arrays are mounted, the array of the light-emitting devices very slightly protruding from the first substrate can be aligned by bringing this protruding array into abutting engagement with the opposite array over the second substrate, using a step portion formed on the side of the abutting end of the second substrate. Therefore, when the device arrays are bonded to the substrates with a conductive adhesive, if the accuracy at which the arrays are installed varies, this variation can be absorbed by the step portion. Hence, some degrees of freedom are given in interconnecting the insulating substrates. Furthermore, the straightness of the light-emitting devices across the junction of the substrates is good. This improves the image quality.

Other objects and features of the invention will appear in the course of the description thereof, which follows.

BRIEF DESCRIPTION OF THE DRAWING

FIGS. 2(I) and 2(II) are cross sections of main portions of the light-emitting device assembly shown in FIG. 1.

DETAILED DESCRIPTION OF THE PREFERRED EMBODIMENT

Figure 1:
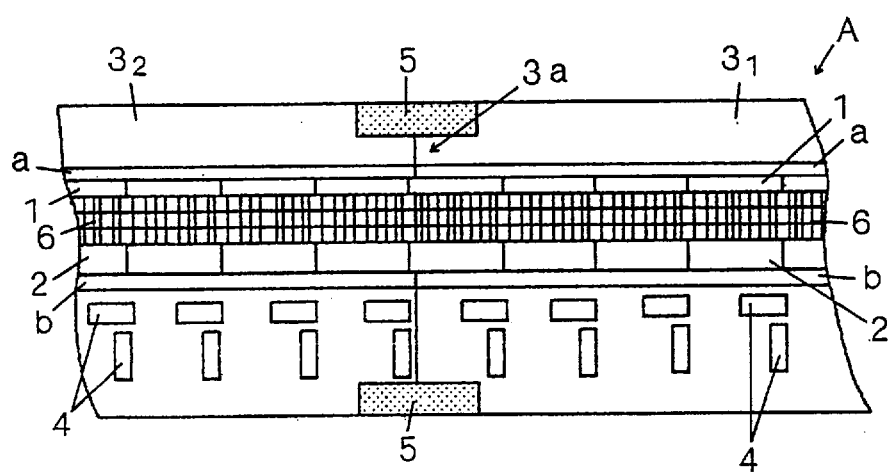
FIG. 1 is a fragmentary plan view of a light-emitting device assembly according to the invention.
Figure 2:
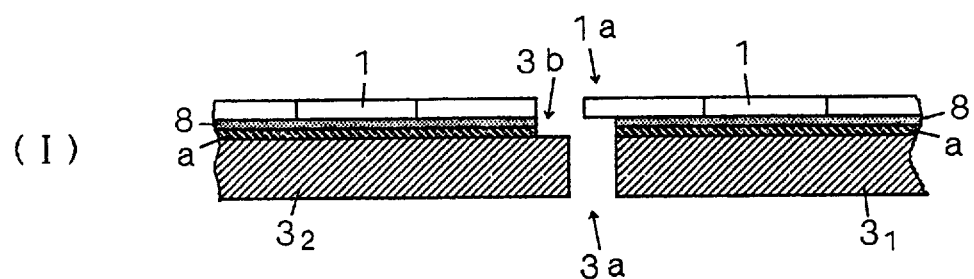
Figure 2:
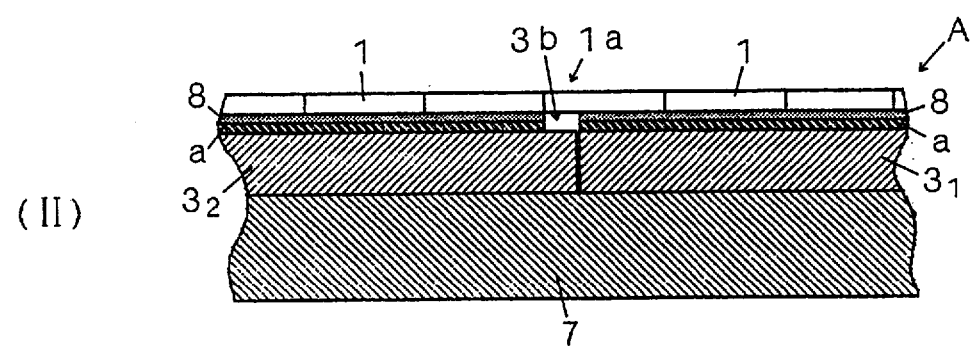

The preferred embodiment of the invention is hereinafter described with reference to the accompanying drawing, in which FIG. 1 is a fragmentary plan view of a light-emitting device assembly according to the invention. FIGS. 2(I) and 2(II) are cross sections of main portions of the light-emitting device assembly shown in FIG. 1.

In FIGS. 1, 2(I), and 2(II), indicated by 1 are light-emitting device arrays. Each device array 1 consists of a plurality of light-emitting devices (for example, 128 LEDs).

Driver ICs 2 drive the light-emitting devices, respectively, of the arrays 1. The device arrays 1 and the driver ICs 2 are mounted on insulating substrates $3_1$ and $3_2$ that are made of, for example, a porous ceramic material from which heat can be dissipated well. A power supply path a, another power supply path b, and a conductive pattern (not shown) are formed on each of the substrates $3_1$ and $3_2$. Electronic parts 4 include chip resistors for adjusting the brightness of each light-emitting device array and chip capacitors for smoothing electric power supplied to the driver ICs. Connecting members 5 are used to connect together the substrates $3_1$ and $3_2$. Resist is removed from parts of the abutting ends 3a of the substrates $3_1$ and $3_2$ to form grooves (not shown). The connecting members 5 are placed in these grooves and bonded there with an adhesive such as an epoxy resin. Electrical connecting members 6 electrically connect the light-emitting device arrays 1 and the driver ICs 2 by wire bonding or other means and are made of gold or other material. A heat-dissipating board 7 made of aluminum acts to dissipate heat generated by the light-emitting device arrays 1. Thus, the light-emitting device assembly, indicated by A, is constructed.

The connecting members 5 serve to connect together the substrates $3_1$ and $3_2$ of a given size. Taking account of thermal expansion of the substrates $3_1$ and $3_3$ due to generation of heat from the light-emitting device arrays 1, the connecting members 5 are made of a material (such as a ceramic) having a coefficient of thermal expansion close to that of the substrates.

The manner in which the substrates $3_1$ and $3_2$ are connected to each other and arranged in line is next described by referring to FIGS. 2(I) and 2(II).

The power supply path a on which the light-emitting devices are installed and a conductive adhesive layer 8 made of silver paste or other material are formed over one substrate $3_1$. The adhesive layer 8 is formed on the power supply path a. The power supply path a and the conductive layer 8 extend to vicinities of the abutting end of the substrate $3_1$. The power supply path a and the conductive adhesive layer 8 are formed over the other substrate 32 and set back a first distance of about 0.2 mm, for example, from the abutting end of the substrate $3_2$. A step portion 3b is formed at the abutting end 3a of this substrate $3_2$. The light-emitting device arrays 1 are mounted on the conductive adhesive layer 8 of the substrate $3_1$ from its one end (not shown). The device array 1 on the substrate $3_1$ which is located on the side of the abutting end protrudes a distance greater than the above-described first distance of 0.2 mm from the end of the power supply path a. The light-emitting device arrays 1 on the conductive adhesive layer 8 of the other substrate $3_2$ range from its one end (not shown) to vicinities of the end of the power supply path a which is set back from the abutting end of the substrate $3_2$. The light-emitting surfaces of the device arrays 1 mounted on the substrates $3_1$ and $3_2$ are regularly spaced from each other and arranged in line.

When the aforementioned substrates $3_1$ and $3_2$ on which the light-emitting devices are mounted are linked to each other, these substrates $3_1$ and $3_2$ are placed on a flat plane of the heat-dissipating board 7. The array 1 of the light-emitting devices on the side of the abutting end has a protruding portion 1a protruding over the substrate $3_1$. The protruding portion 1a is brought over the step portion 3b located on the side of the abutting end of the substrate $3_2$. This protruding portion 1a of the array 1 is made to bear against the array 1 of the light-emitting devices which is set back from the abutting end of the substrate $3_2$. Then, the position of the substrate $3_1$ is so adjusted that the light-emitting surfaces of the arrays 1 of the light-emitting devices mounted on the substrates $3_1$ and $3_2$ are regularly spaced from each other and arranged in line. The arrays 1 of the light-emitting devices on the sides of the abutting ends of the substrates $3_1$ and $3_2$ are aligned with each other. In this case, the light-emitting devices of the arrays 1 are equally spaced from each other. Since the distance between the outermost end of the light-emitting devices of the arrays 1 and the cut end of the arrays is less than half of the spacing between the successive light-emitting devices, the substrates are made to bear against each other with a spacing of several micrometers. That is, the end surfaces of the substrates $3_1$ and $3_2$ are prevented from touching each other. Therefore, the amount by which the array 1 protrudes from one substrate $3_1$ is set greater than the above-described first distance of 0.2 mm or more from the end of the power supply path a.

The substrates $3_1$ and $3_2$ are coupled to each other with the aforementioned connecting members 5, thus obtaining the light device assembly A having desired light-emitting regions. At this time, the end surfaces of the substrates are prevented from touching each other. The substrates are bonded to the heat-dissipating board 7 with a silicone adhesive or the like having good thermal conductivity.

In this structure, the protruding portion la of the light-emitting device array 1 disposed so as to protrude over the light-emitting device-carrying substrate $3_1$ is brought into the step portion 3b formed at the abutting end 3a of the substrate $3_2$. At this location, the protruding portion 1a is caused to bear against the array 1 of the light-emitting devices quite slightly set back from the abutting end of the substrate $3_2$. The position of the substrate $3_1$ is so adjusted that the light-emitting surfaces of the arrays 1 of the light-emitting devices are regularly spaced from each other and arranged in line. In this way, the light-emitting device assembly A having desired light-emitting regions is obtained.

Accordingly, when the light-emitting device array 1 disposed at the abutting end 3a is bonded to the substrate with a conductive adhesive or the like, if a uniform height is not obtained due to insufficient mounting accuracy, then the height nonuniformity can be absorbed by the step portion 3b formed on the side of the abutting end of the substrate $3_2$. Therefore, when the two substrates $3_1$ and $3_2$ are linked to each other, the protruding light-emitting device array 1 and the opposite substrate are prevented from colliding against each other; otherwise they would be damaged. The interconnecting operation is facilitated. Greater degrees of freedom are afforded in manufacturing the assembly. That is, manufacture may be automated. Furthermore, the arrays 1 of the light-emitting devices on both sides of the junction of the two substrates $3_1$ and $3_2$ can be connected to each other with high accuracy. That is, good linearity is obtained across the junction. Hence, the image quality can be improved. In the prior art techniques, a plurality of substrates on which light-emitting devices are mounted are connected to each other, and some of the light-emitting device arrays 1 are made to protrude from both ends of each substrate. In contrast, in the present invention, it is only necessary that one light-emitting device array 1 protrude from at least one of the two substrates $3_1$ and $3_2$. As a consequence, easy management can be accomplished during manufacture.

In the present example, the light-emitting device-carrying substrates $3_1$ and $3_2$ are adhesively bonded to the heat-dissipating board 7. It is desirable to hold the substrates $3_1$ and $3_2$ with resilient substrate-holding members more certainly after the light-emitting device-carrying substrates $3_1$ and $3_2$ are adhesively bonded to the heat-dissipating board 7.

In the illustrated example, the driver ICs 2 protrude in the same way as the light-emitting device arrays 1. It is only necessary for the driver ICs 2 themselves to be capable of being electrically connected with the light-emitting device arrays 1. If the outgoing electrode terminals, i.e., the electrode pads for wire bonding between the light-emitting device arrays 1 and the driver ICs 2, are made narrower than the spacing between the successive light-emitting devices, then the driver ICs 2 can be disposed inside one of the substrates. Furthermore, only one driver IC 2 can be used for the plural light-emitting device arrays 1.

In the present example, the light-emitting device assembly A comprises the two light-emitting device-carrying substrates $3_1$ and $3_2$. Obviously, the invention can be applied to an assembly consisting of three or more light-emitting device-carrying substrates connected in line.

What is claimed is:

1. A light-emitting device assembly comprising:
   a plurality of insulating substrates including a first substrate and a second substrate connected to each other and arranged in line;
   conducting layers formed on said substrates, respectively;
   a plurality of light-emitting device arrays mounted on said conducting layers, respectively;
   said conducting layer formed on said first substrate extending substantially to an abutting end of said first substrate;
   said conducting layer formed on said second substrate being set back a first distance from an abutting end of said second substrate;
   conductive adhesive layers formed on said conducting layers, respectively;
   said light-emitting device arrays on said second substrate being arranged in the vicinity of an end of said conducting layer on a side of the abutting end of said second substrate; and
   said light-emitting device array on said first substrate protruding a second distance greater than said first distance from the end of said conducting layer on said first insulating substrate, said light-emitting device array on said first substrate being made to bear against said light-emitting device array on said second substrate, whereby said plurality of insulating substrates are connected to each other and arranged in-line.

2. The light-emitting device assembly of claim 1, wherein said conducting layer and said conductive adhesive layer over said second substrate are set back by said first distance from the abutting end of said second substrate to thereby form a step portion which acts to absorb variations in the height of the light-emitting device array protruding from the abutting end of said first substrate.

3. The light-emitting device assembly of claim 1, wherein there are further provided connecting members for connecting together said first and second insulating substrates.

4. A method of fabricating a light-emitting device assembly, comprising the steps of:
   preparing a plurality of insulating substrates including a first substrate and a second substrate;
   forming a first conducting layer on said first insulating substrate in the vicinity of an abutting end of said first substrate;
   forming a second conductive layer on said second insulating substrate in such a way that said second conducting layer is set back a first distance from an abutting end of said second substrate;
   forming conductive adhesive layers on said first and second conducting layers, respectively;
   mounting light-emitting device arrays on said conductive adhesive layers in such a way that said devices are disposed in the vicinity of said abutting end of said second insulating substrate;
   causing said light-emitting device arrays over said first insulating substrate to protrude a second distance greater than said first distance;
   mounting said insulating substrates on a flat surface of a heat-dissipating board; and
   bringing said light-emitting device array protruding from said first insulating substrate into abutting engagement with said light-emitting device array set back from the abutting end of said second insulating substrate, whereby said insulating substrates are connected to each other and arranged in-line.

5. A light-emitting device assembly, comprising:
   at least two units each including an insulating substrate, upon which is stacked a conductive layer and a conductive adhesive layer in that order;
   each unit having
   (a) a set back area defined by setting back the conductive layer and conductive adhesive layer by a first distance, and including light-emitting device arrays above and in the vicinity of an end of the conductive layer; and
   (b) a protruding area defined by the light-emitting device arrays above the conductive layer protruding by a second distance, wherein
   said set back area and said protruding area of light-emitting device arrays on adjacent units are located to abut ends when units are arranged in-line.

6. A light-emitting device assembly, comprising:
   a connecting substrate having a first conductive layer thereon with opposite ends of said first conductive layer being set back from an end of said substrate by a first distance, a first conductive adhesive layer formed on the first conductive layer and a first light-emitting device array disposed in the vicinity of an end of said first conductive layer; and
   at least one end substrate having a second conductive layer extending to an end of said end substrate, a second conductive adhesive layer formed on the second conductive layer and a second light-emitting device array over the end substrate and protruding from said end substrate by a second distance, different from the first distance, toward said connecting substrate and being made to bear against said set back first light-emitting device array on said connecting substrate, wherein said connecting substrate and at least one end substrate are configured for connection to each other and arranged in-line.

7. A light-emitting device assembly, comprising:

at least one end substrate each having a first conductive layer with an end of said first conductive layer being set back from a corresponding end of said end substrate by a first distance, a first conductive adhesive layer formed on the first conductive layer and a first light-emitting device array disposed in the vicinity of the end of said first conductive layer; and a connecting substrate having a second conductive layer extending to said end of said at least one end substrate, a second conductive adhesive layer formed on the conductive layer, and a light-emitting device array on the conductive adhesive layer and protruding from one end of said connecting substrate by a second distance, different from the first distance, toward said end substrate and being made to bear against said set back light-emitting device array on an end of said at least one end substrate, wherein said connecting substrate and said at least one end substrate are configured for connection to each other and arrangement in-line.

* * * * *